United States Patent [19]
Cervas

[11] Patent Number: 5,394,093
[45] Date of Patent: Feb. 28, 1995

[54] METHOD AND APPARATUS FOR TESTING VEHICLE ENGINE SENSORS

[75] Inventor: Robert A. Cervas, Highland Heights, Ohio

[73] Assignee: Actron Manufacturing Company, Cleveland, Ohio

[21] Appl. No.: 56,063
[22] Filed: Apr. 30, 1993
[51] Int. Cl.6 .................................................. G01R 31/02
[52] U.S. Cl. ................................ 324/556; 324/503; 324/384
[58] Field of Search ............... 324/378, 384, 503, 537, 324/555, 556; 340/635

[56] References Cited

U.S. PATENT DOCUMENTS

| D. 256,580 | 8/1980 | Tichy | D13/24 |
|---|---|---|---|
| 2,340,765 | 2/1944 | Morch | 320/3 |
| 3,210,653 | 10/1965 | Williams et al. | 324/385 |
| 3,241,055 | 3/1966 | Knudsen et al. | 324/385 |
| 3,462,082 | 8/1969 | Everett | 239/332 |
| 3,629,924 | 12/1971 | Everett | 29/224 |
| 3,733,627 | 5/1973 | Epstein | 7/5.4 |
| 3,762,019 | 10/1973 | Epstein | 29/229 |
| 3,825,740 | 7/1974 | Friedman et al. | 362/183 |
| 3,831,089 | 8/1974 | Pearce | 324/122 |
| 4,041,380 | 8/1977 | Epstein | 324/556 |
| 4,156,191 | 5/1979 | Knight et al. | 324/202 |
| 4,207,511 | 6/1980 | Radtke | 320/6 |
| 4,225,817 | 9/1980 | Kahlden | 324/133 |
| 4,258,305 | 3/1981 | Anglin | 320/2 |
| 4,314,383 | 2/1982 | Epstein | 7/170 |
| 4,321,522 | 3/1982 | Matsunaga | 320/2 |
| 4,327,401 | 4/1982 | Süberg | 362/183 |
| 4,414,698 | 11/1983 | Epstein | 7/170 |
| 4,488,112 | 12/1984 | Thompson et al. | 324/202 |
| 4,491,794 | 1/1985 | Daley et al. | 324/158 R |
| 4,498,239 | 2/1985 | Epstein | 33/168 R |
| 4,514,687 | 4/1985 | Van Husen | 324/158 R |
| 4,521,769 | 6/1985 | Dudeck et al. | 340/635 |
| 4,672,310 | 6/1987 | Sayed | 324/133 |
| 4,673,868 | 6/1987 | Jones, Jr. | 324/545 |
| 4,692,697 | 9/1987 | Bray | 324/158 R |
| 4,783,619 | 11/1988 | Herman | 320/2 |
| 4,829,248 | 5/1989 | Loubier | 324/208 |
| 4,845,435 | 7/1989 | Bohan, Jr. | 324/537 |
| 4,868,508 | 9/1989 | Ohishi | 324/525 |
| 4,894,648 | 1/1990 | Talbot | 340/825.06 |
| 4,924,177 | 5/1990 | Mulz | 324/133 |
| 4,947,110 | 8/1990 | Laass | 324/133 |
| 4,983,955 | 1/1991 | Ham, Jr. et al. | 340/664 |
| 4,999,574 | 3/1991 | Stephens | 324/133 |
| 5,032,791 | 6/1991 | Bates, Jr. | 324/202 |
| 5,153,523 | 10/1992 | Samaniego | 324/550 |
| 5,170,125 | 12/1992 | Bates, Jr. | 324/537 |
| 5,278,508 | 1/1994 | Bowman | 324/384 |

OTHER PUBLICATIONS

"Electric Ignition Systems", Chilton's Guide to Electronic Engine Controls, Jan. 1986.
Ford Rotunda Product Specification Sheet (Dec. 1986) re: Model 105-80002.
Ford Rotunda Product Specification Sheet (Oct. 1987) re: Hall effect tester, Model 105-80003.
Thexton New Product Supplement re: Model No. 125 (Jun. 1, 1986).
Thexton catalog re: Model No. 127 Ford MAP/BP Sensor Testor, Jun. 1986.
Thexton Specification Sheet (Jan. 1989) re model 128.
Wells Ignition Catalog; Two-Minute Sensor Tests, pp. 44–45 and 58–59, Jan. 1990.
Ford Rotunda 105-00001: MAP/BP Tester, Jan. 1990.
Kastar No. 280A: Mass Air Flow (MAF) Sensor Tester, Jan. 1990.
Kastar No. 282A: Manifold Absolute Pressure (MAP) Sensor Tester, Jan. 1990.

Primary Examiner—Kenneth A. Wieder
Assistant Examiner—Glenn W. Brown
Attorney, Agent, or Firm—Calfee Halter & Griswold

[57] ABSTRACT

A multi-test, hand-held instrument and method for testing manifold absolute pressure (MAP) and mass air flow (MAF) sensors includes a housing enclosing a battery and an electrical circuit. The electrical circuit can test d.c. voltage output signals and frequency output signals from MAP/MAF sensors and can test continuity and battery strength. Electrical leads extend outwardly from the housing and are connectable to the sensor being tested. A pair of light indicators, comprising LEDs and resistors connected in parallel, are selectively illuminated to allow the test instrument to be used to test both MAP and MAF sensors, and to test these components on different makes and models of vehicles.

9 Claims, 4 Drawing Sheets

METHOD AND APPARATUS FOR TESTING VEHICLE ENGINE SENSORS

FIELD OF THE INVENTION

The present invention relates generally to vehicle testing instruments, and in particular to a method and apparatus to test the operativeness of certain engine components such as mass air flow sensors and manifold absolute pressure sensors.

BACKGROUND OF THE INVENTION

Various instruments have been developed to test electrical components in vehicles for operability. Such instruments include voltmeters, ammeters and continuity testers. Some of these instruments have been incorporated into hand-held units such that these tests can be easily performed. One such hand-held instrument is a digital multimeter marketed by the assignee of the present invention under Model 2880. This instrument tests solid state electronics, computer and electronic ignition dwell, electronic and conventional ignition systems, and diodes.

Hand-held instruments have also been developed which have the capability to test certain engine sensors and ignition modules in vehicles. For example, one such hand-held instrument developed by the assignee of the present invention is shown and described in Cervas, U.S. Ser. No. 08/002,618 filed Jan. 11, 1993 for "Method and Apparatus for Testing Engine Sensors and Ignition Modules in Vehicles". The instrument described in this reference tests potentiometer-type sensors (e.g., throttle position and EGR position), temperature sensors (e.g., engine coolant, incoming air), Hall effect sensors, oxygen, knock and reluctance sensors, and ignition modules. Due to the nature of the electronic circuitry in this instrument, the instrument can test these components on different makes and models of vehicles, even though the components can have different responses during the testing process depending upon the manufacturer of the component. Moreover, this instrument combines a number of different testing capabilities in a single hand-held instrument, thus reducing the cost to the user of purchasing testing equipment and generally simplifying the overall testing process.

Other hand-held instruments have been developed which test manifold absolute pressure (MAP) sensors for certain vehicle types, such as the Thexton Model No. 127 Ford MAP/BP Sensor Tester; while other instruments have been developed which test mass air flow (MAF) sensors, such as the Kastar Model No. 280A. Manifold absolute pressure sensors and mass air flow sensors are used by the vehicle's engine performance computer to measure the air pressure or the mass of air in the manifold to maintain the proper air/fuel mixture. A malfunctioning MAP/MAF sensor can cause backfiring, hesitation, rough idle, surging, intermittent stalling, hard starting, nostarts, poor engine performance, and poor fuel economy.

However, until this point, applicant is unaware of any device which has the capability to test both manifold absolute pressure and mass air flow sensors in vehicles using a single hand-held instrument and to test these components on a variety of different makes and models of vehicles. Further, some types of MAP/MAF sensors have a voltage output when operating correctly, while others have a frequency output when operating correctly. Thus, the testing instrument must be able to test both voltage and frequency outputs from these components for different makes and models of vehicles.

Accordingly, there is a demand in the industry for a single, integral, hand-held instrument which tests mass air flow and manifold absolute pressure sensors, and tests these components on different makes and models of vehicles while the sensor remains installed in the vehicle. Further, there is a demand in the industry for a simple and convenient instrument of the abovementioned type which includes protection from overload, incorrect connection to the vehicle, and shorting, such that the instrument is not damaged through improper use.

SUMMARY OF THE INVENTION

The present invention provides a single, handheld, integrated test instrument for testing vehicle components such as mass air flow (MAF) sensors and manifold absolute pressure (MAP) sensors. The test instrument includes light indicators which provide a unique display of the test results to enable both MAF and MAP sensors (with either frequency or voltage outputs) to be tested, and to test these components on different makes and models of vehicles. Further, the test instrument includes protection circuitry to prevent damage to the instrument through improper use.

The test instrument of the present invention includes an outer housing enclosing an electrical circuit and a battery. A cover on the housing allows the battery to be removed from a battery compartment and replaced when necessary. Signal and ground leads extend outwardly from the electrical circuit in the housing and are connectable to a manifold absolute pressure sensor or mass air flow sensor.

The electrical circuit for the instrument can test the frequency output of MAP/MAF sensors by converting the frequency output into a voltage signal; and can test the d.c. output voltage of MAP/MAF sensors directly. In either case, the test instrument includes a pair of light indicators, i.e., light emitting diodes (LEDs), for displaying the output voltage signals from the sensors. Each LED is connected with a resistor of predetermined value, such that the light indicators are selectively illuminated at different output voltage levels. Moreover, the illumination of each light indicator varies to enable the instrument to display a range of output voltages when the sensor is exercised. Thus, the test instrument can test both MAP and MAF sensors, and can test these sensors on different makes and models of vehicles, even though the sensors might have different output responses.

The test instrument of the present invention also tests continuity and battery strength. Both light indicators are illuminated to indicate that continuity is present in a circuit, while the brightness of the LEDs provides an indication of battery strength—with only one LED being illuminated when the battery is weak. The battery in the instrument is tested before the vehicle component tests are conducted such that accurate and consistent results are achieved.

In the electrical test circuit described above, protection means (e.g., resistors and diodes) are used to prevent circuit damage due to incorrect connection of the instrument to voltage sources (e.g., to the vehicle battery) or accidental shorting of the instrument.

The present invention further includes a method for testing MAP/MAF sensors for operativeness. The method includes selectively connecting the signal and ground leads from the test instrument to the engine sensor, exercising the sensor, and observing the light indicators on the instrument (i.e., whether the light indicators are illuminated, and the strength of the illumination) to determine whether the sensor is operative.

Accordingly, it is one object of the present invention to provide a single, multi-test, hand-held instrument for testing vehicle components such as manifold absolute pressure and mass air flow sensors.

It is another object of the present invention to provide a test instrument which tests engine components on a number of different makes and models of vehicles, and which is simple and convenient to use.

It is yet another object of the present invention to provide a test instrument for testing various engine components which includes protection circuitry to prevent damage to the instrument from improper use.

It is still another object of the present invention to provide a method for using a hand-held instrument to check MAP/MAF sensors for operativeness.

Other objects of the present invention will become further apparent from the following detailed description and drawings which form a part of this specification.

DESCRIPTION OF THE PREFERRED EMBODIMENT

Figure 1:
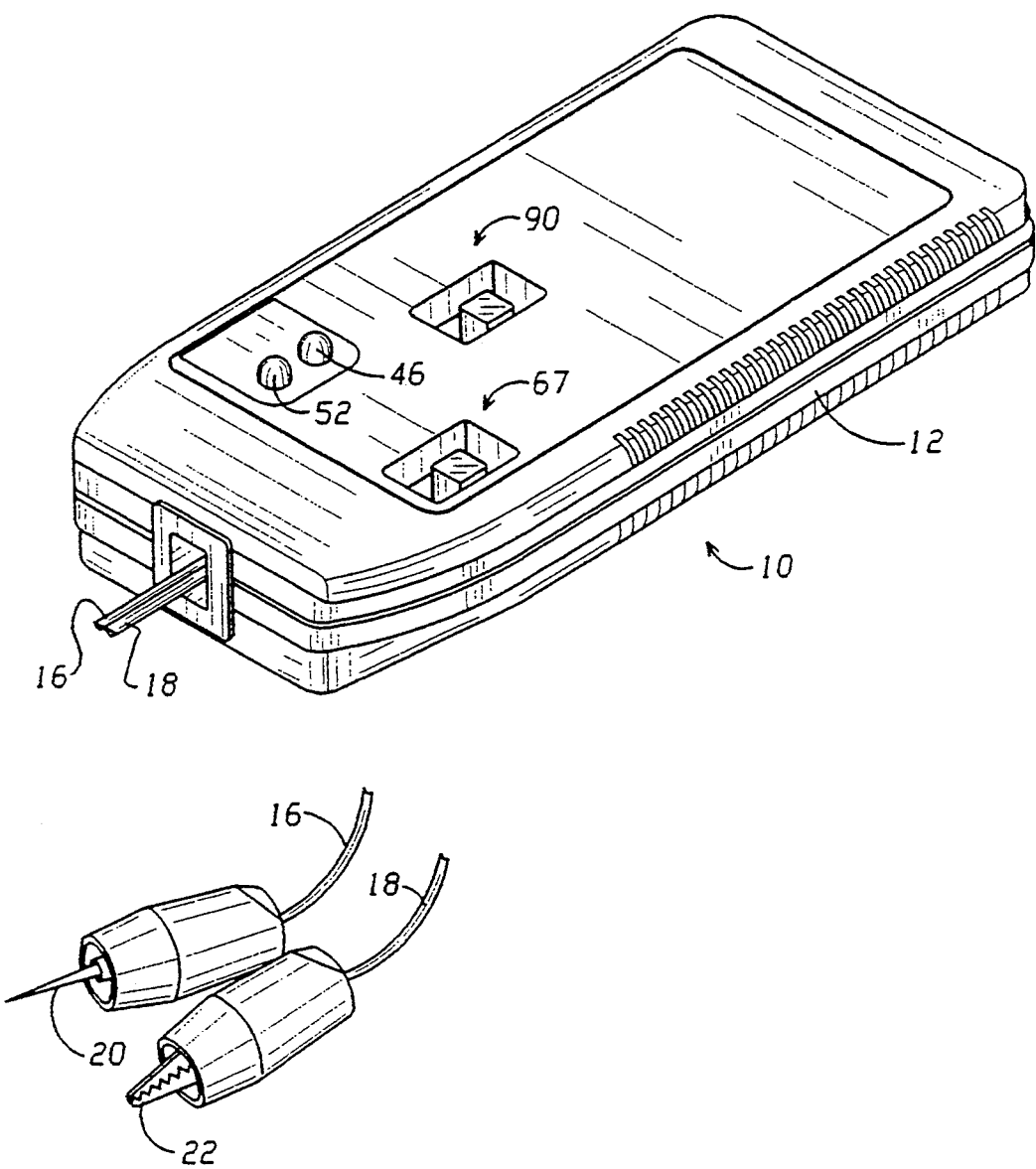
FIG. 1 is a perspective view of the test instrument constructed according to the principles of the present invention.

Referring to the drawings, and initially to FIG. 1, a hand-held, integral test instrument is illustrated generally at 10. The test instrument is designed to test engine components such as mass air flow (MAF) sensors and manifold absolute pressure (MAP) sensors. Some types of MAP sensors and MAF sensors have a frequency output (when operating correctly), while others have a voltage output (when operating correctly), as is known to those skilled in the art.

The test instrument 10 includes a housing 12 comprising one or two housing members manufactured from rigid, relatively inexpensive material (e.g., plastic) and secured together as appropriate. A signal lead 16 extends outwardly from the housing 12 and terminates in probe 20 at its distal end. Further, a ground lead 18 extends outwardly and terminates in clip 22. The signal lead 16 and ground lead 18 are connected at their input end to an electrical test circuit mounted on a circuit board (not shown) within the housing 12.

Figure 2A:
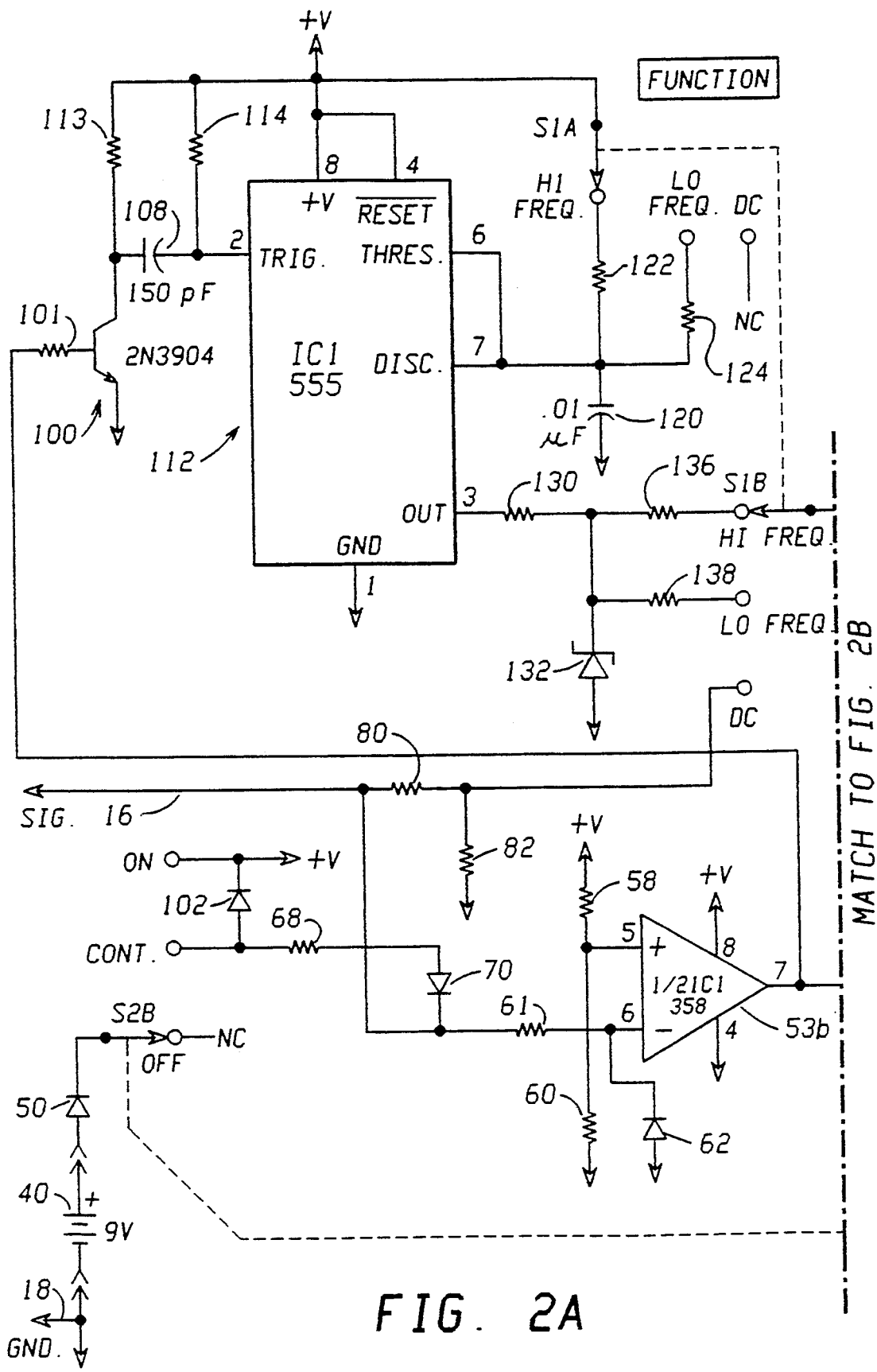
FIGS. 2A and 2B is a schematic illustration of the electrical components of the test instrument of FIG. 1.
Figure 2B:
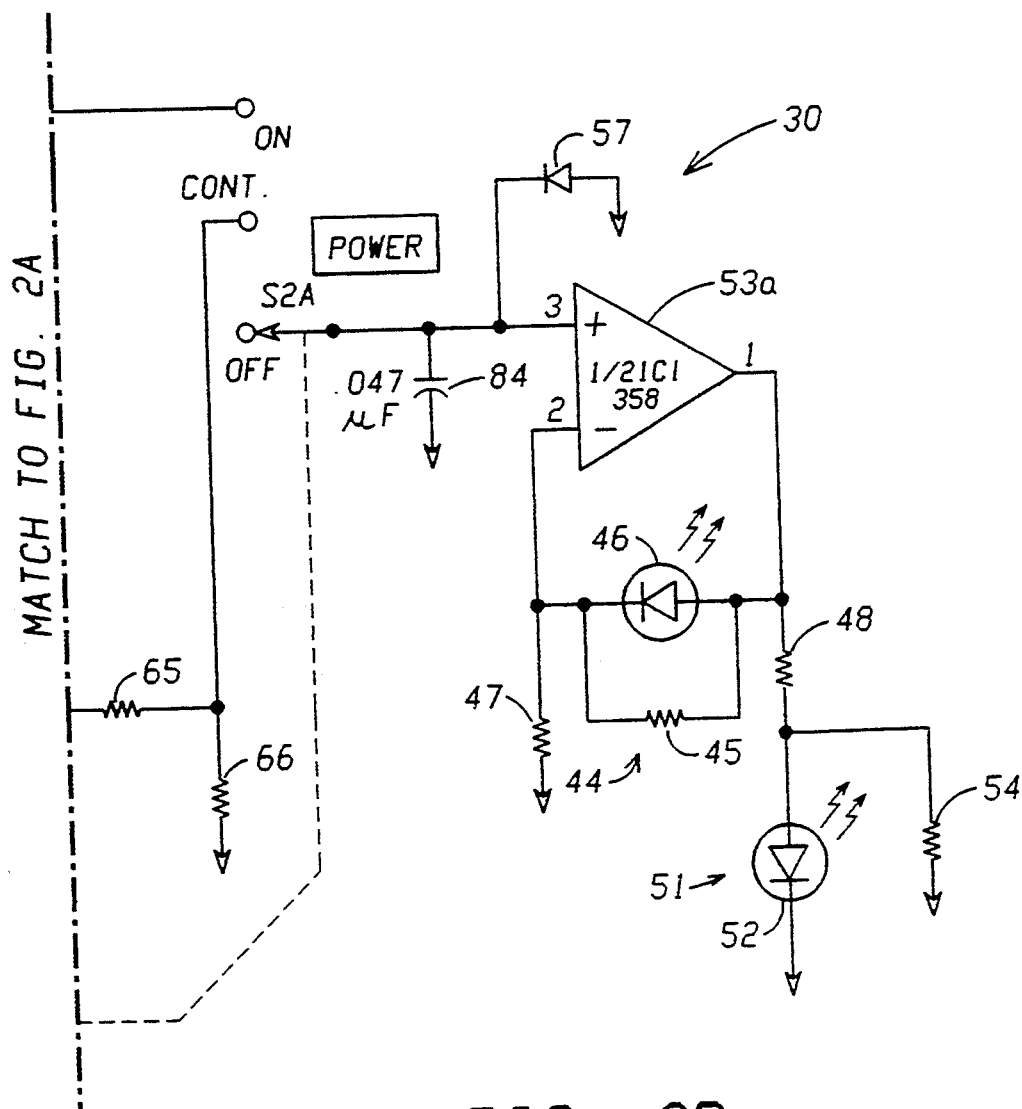

Referring now to FIGS. 2A and 2B, the electrical test circuit, indicated generally at 30, includes a power supply 40 connected at the negative contact to ground lead 18, and at the positive contact to light indicators 44, 51, through electronic components which will be described herein in more detail.

The power supply 40 preferably comprises a 9 Volt alkaline battery which is enclosed within a battery compartment (not shown) in the housing. The battery compartment has a removable cover to allow ready access and replacement of the battery when necessary. The battery can be connected within the electrical circuit in the housing using a conventional type of connector. Diode 50 is inserted between the power supply 40 and the remainder of the test circuit to protect the test circuit from accidental reverse battery connection. Alternatively, power lead(s) (not shown) can extend outward from the circuit board for connection with the vehicle battery to supply power to the test instrument.

The present invention includes means to test the strength of the battery in the test instrument and to test continuity. To this end, an integrated circuit is interposed between the power supply 40 and the light indicators 44, 51, to illuminate the light indicators when appropriate. The integrated circuit includes amplifier 53a and amplifier 53b. The first light indicator 44 preferably comprises a LED 46 and a resistor 45 (6.8 K ohms) connected in parallel between output pin 1 and inverting input pin 2 of amplifier 53a. LED 46 and resistor 45 are also connected to ground through resistor 47 (1 K ohm). Diode 57 protects the non-inverting input pin 3 of amplifier 53a from negative voltages.

The first light indicator 44 is connected through resistor 48 (680 ohms) to the second light indicator 51. The second light indicator 51 preferably comprises a second LED 52 and a second resistor 54 (820 ohms) connected in parallel to ground.

The amplifier 53b of the integrated circuit is connected to the power supply 40 through a voltage divider consisting of resistor 58 (100 K ohms) and resistor 60 (47 K ohms). Resistors 58, 60 provide a reference voltage (between 2 and 3 volts depending on the charge of the battery) to non-inverting input pin 5 of amplifier 53b. Resistor 61 (100 K ohms) and diode 62 protect the inverting input pin 6 of amplifier 53b from overloads and negative voltages. Further, pin 8 of amplifier 53b is connected to the power supply, while pin 4 is connected to ground.

The output pin 7 of amplifier 53b is connected through a voltage divider consisting of resistor 65 (100 K ohms) and resistor 66 (47 K ohms) to the non-inverting input pin 3 of amplifier 53a when a first switching element 67 is set appropriately. The first switching element 67 comprises a three-position slide switch (ON/-CONTINUITY/OFF), which is accessible externally from the housing (see FIG. 3).

When the first switching element 67 is set to the CONTINUITY position, power is supplied from power supply 40 through resistor 68 (4.7 K ohms) and diode 70 to signal lead 16, and from there to amplifier 53b. Diode 70 protects resistor 68 and power supply 40 from overload signals applied to signal lead 16. The output from amplifier 53b is applied to the non-inverting input pin 3 of amplifier 53a and is LOW when the signal lead 16 is unconnected, or if the resistance between signal lead 16 and ground lead 18 is very high. If this is the case, the light indicators will not illuminate, thus indicating an open circuit. When a small resistance (a few K ohms) is connected between the signal lead 16 and the ground lead 18, the voltage at the inverting input pin 6 of amplifier 53b will drop below the reference voltage at the non-inverting input pin 5 of amplifier 53b causing the output pin 7 to go HIGH, thereby illuminating both light indicators and indicating continuity.

To test the strength of the battery, the signal lead 16 and the ground lead 18 are connected (shorted) together, which causes the output voltage from amplifier 53b to go HIGH. The resistors 65, 66 are chosen such that when the battery is weak, the voltage applied to the light indicators will be such that only one light indicator (LED 46) will illuminate. At proper battery strength, both LED 46 and LED 52 will be illuminated, with the brightness of LED 52 depending on the battery voltage. Thus, the present invention provides simple and easy means to check the strength of the battery and to test for continuity.

The test circuit also includes means to check manifold absolute pressure and mass air flow sensors. As is known to those skilled in the art, certain MAP/MAF sensors have a frequency output, while others have a d.c. output voltage. To test MAP/MAF sensors having a d.c. output voltage, the probe 20 at the end of signal lead 16 is connected to the sensor being tested. It is not necessary to remove the sensor from the vehicle for this, or any of the other tests described herein. Rather, the probe 20 can pierce the insulation surrounding the signal output wire from the sensor while the sensor remains connected within the engine electronics.

The clip 22 at the end of the ground lead 18 is then connected to a ground on the sensor, or to the vehicle ground. The sensor is then exercised, i.e., the vehicle is started, allowed to warm up, and the accelerator is depressed. The signal received along signal lead 16 is applied through a voltage divider consisting of resistor 80 (100 K ohms) and resistor 82 (100 K ohms). Resistors 80, 82 also protect the noninverting input pin 3 of amplifier 53a from overloads.

The test circuit also includes a second switching element, indicated generally at 90, which is also a three-position switch (DC/LO FREQ./HIGH FREQ.) (see FIG. 3). When the second switching element is switched to the DC position, the DC voltage signal along signal line 16 is applied to the light indicators 44, 51. Capacitor 84 is also connected to the non-inverting pin 3 of amplifier 53a to filter noise on signal line 16.

The amplifier 53a, resistors 45, 47, 48, 54, and LEDs 46 and 52, are connected in a voltage-to-current configuration such that incoming voltages are converted to a proportional current passing through LEDs 46 and 52. When a small voltage signal is received from the sensor under test, resistor 45 and resistor 54 shunt current around the LEDs 46, 52 and neither LED is illuminated. However, increasing the current makes the voltage rise across resistor 45 until the turn-on threshold of LED 46 is reached and LED 46 begins to illuminate. At this point, LED 52 remains off because resistor 54 has a lower value than resistor 45, and the voltage across resistor 54 is too low to illuminate LED 52. Further, resistor 45 serves to shunt current away from LED 46 so that the brightness of this LED increases more gradually than if all the current were flowing through LED 46 alone.

Eventually, an increasing current flow reaches a point where the voltage drop across resistors 48 and 54 is high enough to illuminate LED 52. Resistors 48 and 54 are chosen such that LED 52 will begin to illuminate when the voltage is at about mid-scale (about 1.25 volts at pin 3 of amplifier 53a). Both LEDs are brightly lit at full scale input. The strength of illumination of the LEDs depend upon the level of the voltage signal received on signal line 16. The test instrument can therefore cover a broad range of voltage levels to test most commercially-available MAP/MAF sensors with voltage output signals.

Finally, the test circuit includes means to test MAP/MAF sensors which have frequency output signals. To this end, the test circuit includes a frequency-to-voltage converter consisting of npn transistor 100 which receives a squared-up signal from the output pin 7 of amplifier 53b through resistor 101 (22 K ohms). Diode 102 prevents power from entering the signal lead 16 through resistor 68. Transistor 100 produces a rapid, negative-going pulse from output pin 7 of amplifier 53b, which is coupled through capacitor 108 (150 pf) to the trigger pin 2 of timing circuit 112. Timing circuit 112 is configured as a one-shot multivibrator. Resistor 113 (22 K ohms) is coupled between the input to capacitor 108 and the power supply; while resistor 114 (47 K ohms) is coupled between the output of capacitor 108 and the power supply.

Figure 3:
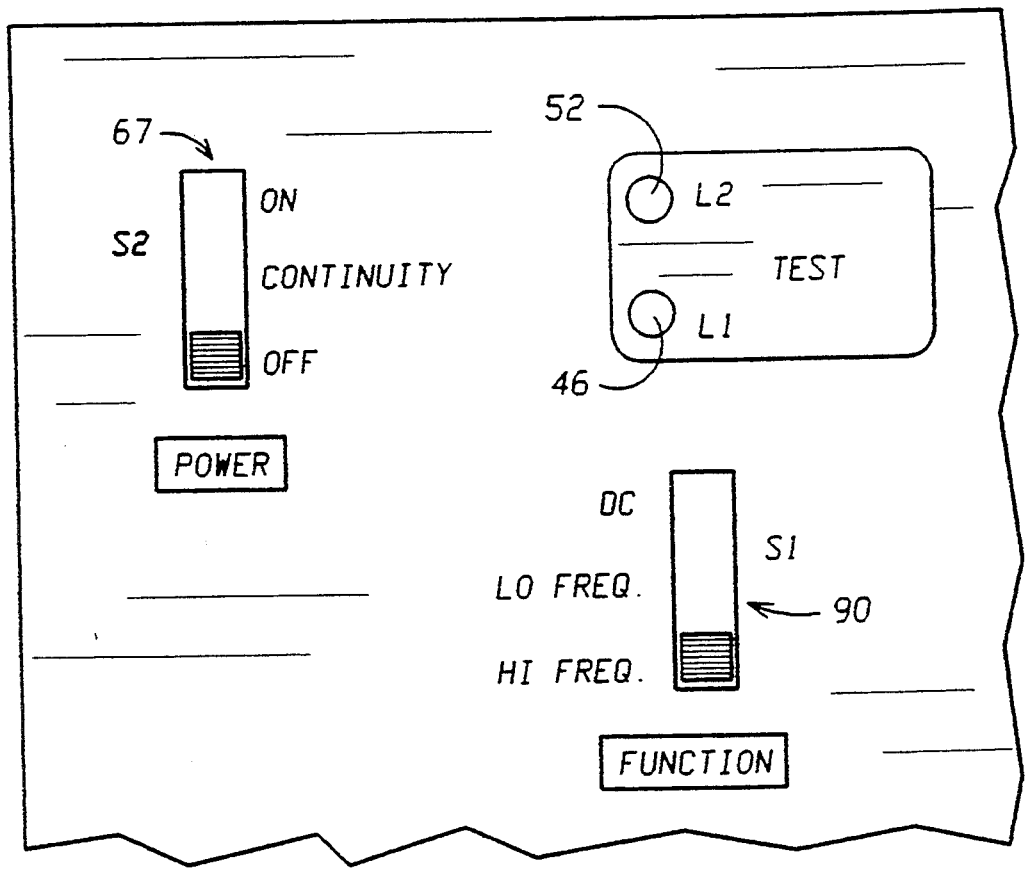
FIG. 3 is a partial breakaway perspective view of the test instrument of FIG. 1.

The width of the output pulse from the one-shot multivibrator is determined by capacitor 120 (0.01 μf), and either resistor 122 (4.99 K ohms) or resistor 124 (205 K ohms), depending upon the position of switching element 90 (see FIG. 3). In particular, when switching element 90 is in the HI FREQ. position, the output pulse is applied through resistor 122 (which is connected to the power supply as shown); while when switching element is in the LO FREQ position, the output pulse is applied through resistor 124 (which is then connected to the power supply). The LO FREQ. or HI FREQ. positions of the second switching element are chosen depending upon whether the sensor provides a low frequency output (0–220 HZ), or a high frequency output (0–10 KHZ), which can be easily determined by those skilled in the art. The output pulses from the one-shot multivibrator are clamped by resistor 130 (2 K ohms) and zener diode 132 (5.1 volts) to prevent changes in power supply voltage from affecting pulse height.

The output pulses from the multivibrator are filtered by resistor 136 (47 K ohms) or resistor 138 (470 K ohms), depending upon the position of switching element 90 (see FIG. 3). In particular, when switching element 90 is in the HI FREQ. position, the output pulses are filtered through resistor 136 before being applied to the light indicators; while when the switching element 90 is in the LO FREQ. position, the output pulses are filtered by resistor 138 before being applied to the light indicators. The greater the frequency of the incoming signal, the more pulses coming from one-shot multivibrator 112, and the greater the filtered dc voltage reaching the light indicators. Thus, increasing frequency produces increasing brightness. Again, LED 46 is illuminated first at lower frequencies, while LED 52 is also illuminated at higher frequencies. The test instrument can therefore also cover a broad range of output frequencies to test most commercially-available MAP/MAF sensors with frequency output signals.

As discussed above, the test instrument can be set such that one or both of the LEDs is lit to indicate sensor operativeness, or can have a varying illumination to test sensor operability over a range of output voltage or frequency levels. For example, it can be important to determine not only that a particular sensor is operating properly (i.e., is "on" or "off"), but also that the sensor is operating over an anticipated voltage or frequency range. In any case, it has been determined that only two LEDs are necessary to provide an indication of sensor operability over the entire range of anticipated voltage and frequency levels for most commercially-available sensors.

Using these principles, the value of the resistors in the light indicators can be chosen such that the test circuit is capable of testing both MAP and MAF sensors regardless of whether the particular sensor provides a frequency or voltage output, and can test the sensors over a range of output voltages for different makes and/or models of sensors. For example, with the resistor values indicated previously, the test instrument can test voltage levels of up to 5 volts and frequencies of up to 220 HZ (in the LO FREQ. position), or up to 10 KHZ (in the HI FREQ. position).

Moreover, the light indicators are illuminated at relatively low voltages by virtue of the amplification of the signal by amplifier 53A. For example, at least one light indicator is illuminated at voltages as low as 1 volt, because of the amplification provided by amplifier 53A. Without such amplification, the light indicators would not be illuminated until about 1.6 volts using the values indicated. A lower response level can increase the capability and efficiency of the test instrument by providing more rapid responses. These levels have been found appropriate to test most MAP and MAF sensors in various makes of cars, e.g., GM, Ford and Chrysler. Appropriate instruction manuals can be included along with the test instrument to describe the output results anticipated for the MAP/MAF sensors and for different makes and models of vehicles when the sensors are operating properly.

Finally, when the testing is complete, the first switching element 67 is moved to the "OFF" position and the test instrument can be stored away.

Accordingly, as described above, the present invention provides a novel and unique hand-held test instrument which can be used to test MAP and MAF sensors, and to test these sensors on different makes and models of vehicles even if the response from the components is slightly different. The test instrument is simple and convenient to use and includes protection circuitry to prevent damage to the instrument in the event of improper use.

The principles, preferred embodiments and modes of operation of the present invention have been described in the foregoing specification. The invention which is intended to be protected herein should not, however, be construed as limited to the particular form described as it is to be regarded as illustrative rather than restrictive. Variations and changes may be made by those skilled in the art without departing from the spirit of the present invention. Accordingly, the foregoing detailed description should be exemplary in nature and not as limiting to the scope and spirit of the invention set forth in the following claims.

What is claimed is:

1. A multi-test, integral, hand-held instrument for testing both manifold absolute pressure and mass air flow sensors, comprising:

a housing enclosing a battery and an electrical circuit, said electrical circuit including a first circuit means for testing manifold absolute pressure and mass air flow sensors having a frequency output signal and for converting the frequency output signal to a corresponding voltage output signal, and a second circuit means for testing mass air flow and manifold absolute pressure sensors having a dc voltage output signal, said electrical circuit also including a pair of light indicators for visually displaying an indication of sensor operativeness, the intensity of illumination of said pair of light indicators varying when the sensor being tested provides a varying output signal, at least one switch device for selecting said first or second circuit means, and lead means for electrically connecting said electrical circuit to the sensor being tested.

2. An instrument as in claim 1, wherein each light indicator comprises a LED/resistor pair, with each LED in each LED/resistor pair being connected in parallel with a corresponding resistor, each of said resistors having a different resistance value such that one LED is illuminated at a lower voltage or frequency level than the other LED when a sensor is tested.

3. An instrument as in claim 2, wherein said lead means comprises a ground lead for supplying an electrical ground connection to the sensor, and a signal lead for sensing an output voltage or frequency signal from the sensor, said ground and signal leads connecting to ground and signal connections, respectively, in the electrical circuit and being connectable to signal output and ground connections on a sensor.

4. An instrument as in claim 2, further including means to protect said electrical circuit from voltage overload and shorts from incorrect connections of said signal and ground leads.

5. An instrument as in claim 2, wherein said electrical circuit further includes a third circuit means for testing the strength of said battery and for continuity checks, and a second switch device for selecting between said first and second circuit means and said third circuit means, wherein at least one of said light indicators provide a visual indication of the strength of said battery when said second switch device is set appropriately.

6. An instrument as in claim 2, further including an amplifier means for amplifying the voltage output signal before being applied to the LEDs such that one of said LEDs is illuminated at low voltages.

7. A method for testing mass air flow and manifold absolute pressure sensors, comprising the steps of:

supplying a hand-held testing device electrically connectable to the sensor, said hand-held testing device including:

i) a housing enclosing a battery and an electrical circuit, said electrical circuit including circuit means electrically interconnected with said battery for testing mass air flow and manifold absolute pressure sensors, and at least two LED/resistor pairs having distinct voltage illumination levels for visually indicating the operability of a mass air flow or manifold absolute pressure sensor across a broad output signal range, and ii) lead means for electrically connecting said electrical circuit to the sensor being tested, connecting the lead means to a sensor, and exercising the sensor, and observing said LEDs in the LED/resistor pairs to determine whether the sensor is operating properly, said LEDs selectively illuminating depending upon the output signal level from the sensor undergoing the test.

8. A method as in claim 7, wherein said sensor is exercised such that the sensor provides an output signal which varies across a range, said LEDs varying in brightness to visually indicate the range of the output signal.

9. A method as in claim 8, further including the step of initially checking the strength of the battery in the instrument by selectively actuating a battery test switch incorporated into the instrument.

* * * * *